United States Patent

[11] 3,622,334

[72] Inventors Robert Bartholomew Hurley
Matawan;
Sam Lazarus, Englishtown, both of N.J.

[21] Appl. No. 889,742
[22] Filed Dec. 31, 1969
[45] Patented Nov. 23, 1971
[73] Assignee E. I. du Pont de Nemours and Company
Wilmington, Del.

[54] PHOTOPOLYMERIZABLE COMPOSITIONS AND ELEMENTS CONTAINING HETEROCYCLIC NITROGEN-CONTAINING COMPOUNDS
9 Claims, No Drawings

[52] U.S. Cl. .......... 96/83, 96/35.1, 96/115 P, 156/13
[51] Int. Cl. .......... G03c 1/70
[50] Field of Search .......... 96/115 P, 115, 35.1, 83

[56] References Cited

UNITED STATES PATENTS 3,479,185 11/1969 Chambers .......... 96/84

FOREIGN PATENTS 1,152,368 5/1969 Great Britain .......... 96/35.1

*Primary Examiner*—Ronald H. Smith
*Attorney*—Lynn Barratt Morris

ABSTRACT: A photopolymer resist composition comprising (A) an ethylenically unsaturated compound containing at least one polymerizable ethylenic group ($CH_2$ C ) capable of forming a high polymer by photoinitiated addition polymerization; (B) a thermoplastic organic polymer binder and (C) a photoactivatable addition polymerization initiator provides improved adhesion to a solid support in aqueous plating solutions when the composition includes a small amount of a compound having the formula

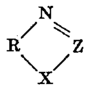

where R is substituted or unsubstituted ortho arylene, X is $CH_2$, NH, S, O, or Se; Z is N or C—Y, where Y is H, $NH_2$, halogen, alkyl.

PHOTOPOLYMERIZABLE COMPOSITIONS AND ELEMENTS CONTAINING HETEROCYCLIC NITROGEN-CONTAINING COMPOUNDS

BACKGROUND OF THE INVENTION

This invention relates to processes and elements for making photoresists. More particularly it relates to photoresist elements useful in aqueous plating solutions.

It is well known to prepare photopolymer resist compositions for use in aqueous plating solutions. These compositions contain inter alia (A) an ethylenically unsaturated compound containing at least one terminal ethylenic group, and being capable of forming a high polymer by photoinitiated addition polymerization, (B) a thermoplastic organic polymeric binder, (C) a photoactivatable addition polymerization initiator. Suitable compositions, elements and processes for preparing such resists are described in Celeste, U.S. Pat. No. 3,469,982, and references cited therein. A common use for such a film resist is in the etching of copper images. In this application, the photoresist is laid down on a suitable substrate, e.g., a copper-clad phenolic resin or epoxy resin board, and exposed to actinic light through a transparency. A suitable developing solution is used to remove the resist in the unexposed areas. Following this the unprotected surface can then be modified and utilized in various manners. Thus, it can be treated with a suitable fluid reactant to form an etched surface, or metal plated, anodized, colored, coated, or processed in other manners.

When the resist is used in aqueous plating solutions, a problem exists in that the hardened areas of the film are undercut by the aqueous plating solution. This results in the resist separating or lifting from the support. This characteristic is undesirable due to the loss of edge definition in the pattern. A large number of boards must of necessity be discarded for this reason.

SUMMARY OF THE INVENTION

It is an object of this invention to provide a photopolymer resist film having improved characteristics in aqueous plating solutions. A still further object of this invention is to provide a photopolymer resist composition which displays improved adhesion to a base support in aqueous plating solutions.

According to this invention a photopolymer resist having improved adhesion characteristics in aqueous plating solutions is obtained by addition of a small amount of a compound having the formula

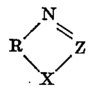

where R is orthoaromatic hydrocarbon nucleus, e.g., benzene or naphthalene; X is $CH_2$, NH, S, O, or Se; Z is N or C—Y and Y is H, $NH_2$, alkyl of one to four carbons or halogen, e.g., Cl or Br; to a photoresist composition comprising an ethylenically unsaturated compound containing at least one polymerizable ethylenic group and having a capacity of forming a high polymer by photoinitiated addition polymerization, and a thermoplastic organic polymer binder. Alkyl may be $CH_3$, $C_2H_5$, $C_3H_7$, or $C_4H_9$. The photopolymerizable composition is applied to a support, exposed, and processed as described in Celeste, U.S. Pat. No. 3,469,982, Sept. 30, 1969.

Photoresist solutions for making the photopolymerizable compositions that are described above may comprise a wide variety of photopolymerizable compounds and suitable binders therefore. For example, the photopolymerizable materials disclosed in Plambeck, U.S. Pat. No. 2,760,863, Aug. 28, 1956, are quite suitable as are the novel polymerizable polymeric esters disclosed in Schoenthaler, U.S. Pat. No. 3,418,295, Dec. 24, 1968. In the Plambeck patent there are disclosed various suitable ethylenically unsaturated compounds, thermal plastic polymeric binders, addition polymerization initiators activatable by actinic light and proportions of constituents useful in accordance with this invention. Suitable ethylenically unsaturated polymers are those disclosed in Celeste et al., U.S. Pat. No. 3,261,686, July 19, 1966, and Cohen et al., U.S. Pat. No. 3,380,831, Apr. 30, 1961. In the case of polymerizable polymers, no binder is necessary, although a small amount may be used. Other ingredients described in the patents listed above, such as plasticizers, thermal inhibitors, colorants, fillers, etc., also may be present. As disclosed by the references set out above some of the ingredients can act in a dual role. For example, in the monomer binder systems, the ethylenically unsaturated photopolymerizable monomer can also act as a plasticizer for the thermoplastic binder.

Among the heterocyclic nitrogen-containing compounds useful in the compositions and elements of this invention are: benzimidazole, 5-nitrobenzimidazole, 5-methylbenzimidazole, benzotriazole, and 2-aminobenzothiazole.

DETAILED DESCRIPTION OF THE INVENTION

In practicing the invention a photopolymerizable composition is prepared as described in the above-mentioned Schoenthaler patent. A small amount of the heterocyclic nitrogen-containing compound, e.g., benzimidazole, 5-nitrobenzimidazole, 5-methylbenzimidazole, benzotriazole, or 1-chlorobenzotriazole is added during the preparation of the photoresist composition. The advantageous effects of this addition can be obtained with as little as 0.001 percent by weight of constituents (A) and (B) of the nitrogen-containing heterocyclic compound in the photopolymer composition. Larger amounts of the heterocyclic nitrogen compounds may be added, with the upper limits for each compound being governed by the solubility of the compound in the photoresist composition. The compositions of this invention primarily improve adhesion to copper substrates, however, the adhesion of the film composition to other substrates is not adversely affected.

Other suitable photoinitiators for use in the photopolymerizable compositions of this invention are the triarylimidazolyl dimers and p-aminophenyl ketones described in assignee's Chang et al., U.S. Pat. application Ser. No. 731,733 filed May 24, 1968, now U.S. Pat. No. 3,549,367; and the 2,4,5-triphenylimidazolyl dimers described in Chambers, U.S. Pat. No. 3,479,185, Nov. 18, 1969. The photopolymerizable elements of this invention are prepared by coating the photoresist compositions onto any suitable solid, strippable film support which is provided with a strippable protective cover sheet, as described in U.S. Pat. No. 3,469,982.

The preferred embodiment of this invention, however, uses a copper-clad epoxy resin board as the solid base support upon which the photopolymerizable layer is applied. It should be noted that the layer can be laid down on the metal or other etchable surface, and the strippable film can be removed before or after exposure.

The coated element is exposed to a printed circuit transparency. The transparency may be a process negative or positive. Suitable exposure techniques are described in the aforementioned Celeste U.S. patent.

After exposure of the photopolymerizable layer, the unexposed areas of the photopolymer film are developed with a suitable solvent, e.g., methyl chloroform. Since the photopolymerizable compositions of this invention have been coated on a copper-clad resin or polymer board, the base layer of copper is revealed after this step. The photopolymerizable element is then made the cathode in a copper pyrophosphate electroplating solution, and electroplated at a cathode current density of approximately 30 amperes per sq.ft. at 1½ volts for about 30 minutes.

Such methods are advantageously employed in the preparation of thick (more than 0.002-inch) printed circuit boards. With the nitrogen-containing heterocyclic compounds of this invention in the resist composition, postexposure baking can be eliminated from the plating process. Resist film sensitized with orthochloro-hexarylbisimidazolyl dimers or tertiary 2-butylanthraquinone gave less resist to copper adhesion loss during copper electroplating, with benzimidazole added to the film. Other uses for the compositions of this invention includes the preparation of relief images and printing plates.

The following examples set forth in greater detail the nature and advantages of the present invention. It is understood that these examples are illustrative only and are not intended to limit the scope of the invention.

EXAMPLE I

The following photoresist composition was prepared.

| | |
|---|---|
| Trimethylolpropane triacrylate | 26.4 g. |
| Triethylene glycol diacrylate | 8.2 g. |
| Polymethyl methacrylate (inherent visc. 0.20) | 58.4 g. |
| Bis(dimethylamino)benzophenone | 1.0 g. |
| Benzophenone | 2.0 g. |
| Victoria Pure Blue BO Dye | 0.1 g. |

Five additional batches of the above composition were also prepared, however, each contained 0.5 g. of one of the following heterocyclic nitrogen-containing compounds.

Compound 1—benzimidazole
Compound 2—2-aminobenzimidazole
Compound 3—2-methylbenzimidazole
Compound 4—2-aminobenzothiazole
Compound 5—5-nitrobenzimidazole Each composition was skim coated, laminated, exposed, and developed, as described in example I of Celeste, U.S. Pat. No. 3,469,982, to give an imaged copper-clad board the exposed and insoluble areas of the photopolymer resist remaining on the copper, and the unexposed and soluble areas washed away. After development, each resist board is rinsed with water then dipped in 25 percent sulfuric acid for 20 seconds, followed by a water rinse, treatment in ammonium persulfate for 25 seconds, water rinse once again, and finally, treatment with a distilled water wash.

Each resist copper board is now placed in a copper pyrophosphate plating bath of the following composition.

| | |
|---|---|
| Copper $Cu^{+2}$ | 30 g./l. |
| Pyrophosphate $P_2O_7$ | 200 g./l. |
| Nitrate $NO_3$ | 8 g./l. |
| Ammonia $NH_3$ | 2 g./l. |
| Orthophosphate $HPO_4$ | 0.1 g./l. |

This bath is held at pH 8.2, and 122° F. A weight ratio of pyrophosphate to copper is 7.5. The bath is operated at 1.5 volts with a cathode current density of 30 amperes/sq.ft. Copper is deposited by the electroplating bath for 30 minutes on the unprotected nonresist areas of the imaged copper-clad board, after which the boards are removed from the bath and dried in air.

The resist was stripped off using methylene chloride after a ferric chloride insoluble metal was plated over the electrically deposited copper. All boards were etched in 45° Baumé ferric chloride and formed suitable pattern plated, printed circuit resists.

EXAMPLE II

Six printed circuit compositions were prepared coated, exposed, developed, and electroplated as in example I. The adhesion of each film to the copper board was tested in the following manner. A 3-inch wide strip of cellophane adhesive tape was applied to each board, and then pulled off. The amount of resist left on the tape is proportional to the deterioration of the resist in the bath. The sample which contained no heterocyclic nitrogen-containing additive showed the greatest amount of film adhering to the cellophane tape. The samples which contained benzimidazole showed the least amount of film adhering to cellophane tape. Other samples containing 2-aminobenzimidazole, 2-methylbenzimidazole, 2-aminobenzothiazole, and 5-nitrobenzimidazole had less resist adhering to them than the untreated sample.

All samples treated with heterocyclic nitrogen-containing compounds of this invention showed improved adhesion of the resist to copper board during the electroplating step. The sample containing no heterocyclic adjuvant blistered and began to flake on the solid support surface subsequent to the electrodeposition of copper.

EXAMPLE III

Three batches of the following photoresist composition were prepared as below:

| | |
|---|---|
| Polymethylmethacrylate (Inherent Visc. 1.20) | 10.4 g. |
| Polymethylmethacrylate (Inherent Visc. 0.20) | 48.0 g. |
| Triethylene Glycol Diacrylate | 8.2 g. |
| 2-o-Chlorophenyl-4,5-diphenylimidazolyl dimer | 5.68 g. |
| Benzimidazole | 0.2 g. |
| Victoria Pure Blue BO Dye | 0.022 g. |

To each of these compositions was added 26.4 g. of one of the following monomer compounds.

Trimethylolpropane Triacrylate
Trimethylolpropane Trimethacrylate
Pentaerythritoltriacrylate Each composition was skim coated, laminated, exposed, developed, and electroplated as described in example I.

A cellophane adhesive tape pickoff test as set forth in example II was run on a dried sample of each film composition.

All three samples containing the heterocyclic nitrogen-containing element of this invention had lesser amounts of film adhering to the tape when pulled off, as compared with similar compositions which did not contain this adjuvant.

All samples were suitable for use as printed circuit boards.

EXAMPLE IV

Five batches of the following photoresist composition was prepared:

| | |
|---|---|
| Polymethylmethacrylate/Methacrylic Acid (Inherent Visc. 1.20) | 10.4 g. |
| Polymethylmethacrylate/Methacrylic Acid (Inherent Visc. 0.20) | 48.0 g. |
| Triethylene Glycol Diacetate | 8.2 g. |
| Trimethylolpropane Triacrylate | 26.4 g. |
| Benzimidazole | 0.2 g. |

To each batch was added one of the following free-radical generating electron doner agents:

| | |
|---|---|
| 2-o-Chlorophenyl-4,5-diphenylimidazolyl dimer | 5.68 g. |
| Tertiary 2-Butylanthraquinone | 3.5 g. |
| Bis-Dimethylamino Benzophenone | 1.0 g. |
| Benzophenone | 2.0 g. |
| 7-diethylamino-4-methylcoumarin | 2.0 g. |

The composition was coated, exposed, developed and plated as in example I.

All samples provided useful printed circuit boards.

EXAMPLE V

The following photoresist composition was prepared, coated, exposed, developed and electroplated as in example I.

| | |
|---|---|
| Trimethylol Propane Triacrylate | 26.4 g. |
| Triethylene Glycol Diacrylate | 8.2 g. |
| Chlorinated Rubber | 58.0 g. |
| Bis(Dimethylamino) benzophenone | 1.0 g. |
| Benzophenone | 2.0 g. |
| Victoria Pure Blue Bo Dye | 0.2 g. |

A second similar composition containing 2.0 g. of benzotriazole was prepared, coated, exposed, developed and electroplated as in example I.

Both samples were tested for adhesion as in example II. The sample containing the heterocyclic nitrogen-containing compound of this invention displayed improved adhesion of the resist to copper board in copper, metal and gold plating, when compared to the sample which did not contain the compound.

The embodiments of the invention in which an exclusive property or privilege is claimed are defined as follows:

1. A photopolymerizable element comprising
 a. a support, and
 b. a photopolymerizable layer carried by the support, said layer comprising
  1. a nongaseous ethylenically unsaturated compound containing at least one polymerizable ethylenic group and capable of forming a high polymer by photoinitiated addition polymerization,
  2. a thermoplastic organic polymer binder, and
  3. an addition polymerization initiator activatable by actinic radiation, characterized in that said layer contains a small amount of a heterocyclic nitrogen-containing compound of the formula

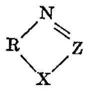

wherein R is an orthoaromatic hydrocarbon nucleus, X is $CH_2$, NH, S, O, or Se, Z is N or C—Y, wherein Y is H, $NH_2$, alkyl of one to four carbon atoms, or halogen.

2. An element according to claim 1, wherein the heterocyclic nitrogen-containing compound is present in an amount of at least 0.001 percent of the total weight of constituents (1) and (2).

3. An element according to claim 1, wherein said nitrogen-containing compound is benzimidazole.

4. An element according to claim 1, wherein said nitrogen-containing compound is benzotriazole.

5. An element according to claim 1, wherein said support is strippable from said layer.

6. An element according to claim 1, wherein said support is strippable from said layer and transparent to actinic radiation.

7. A photopolymerizable composition comprising
 1. a nongaseous ethylenically unsaturated compound containing at least one terminal ethylenic group and capable of forming a high polymer by photoinitiated addition polymerization,
 2. a thermoplastic organic polymer binder, and
 3. an addition polymerization initiator activatable by actinic radiation, characterized in that said composition contains a small amount of a heterocyclic nitrogen-containing compound of the formula

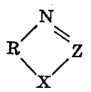

wherein R is an orthoaromatic hydrocarbon nucleus, X is $CH_2$, NH, S, O, or Se, Z is N or C—Y, wherein Y is H, $NH_2$, alkyl of one to four carbon atoms, or halogen.

8. A composition according to claim 7, wherein said nitrogen-containing compound is benzimidazole.

9. A composition according to claim 7, wherein said nitrogen-containing compound is benzotriazole.

* * * * *